United States Patent [19]

Fukuda et al.

[11] 4,378,260
[45] Mar. 29, 1983

[54] PROCESS FOR PRODUCING A SEMICONDUCTOR DEVICE

[75] Inventors: Takeshi Fukuda, Tokyo; Yoshito Ichinose, Kawasaki, both of Japan

[73] Assignee: Fujitsu Limited, Kawasaki, Japan

[21] Appl. No.: 229,588

[22] PCT Filed: May 17, 1980

[86] PCT No.: PCT/JP80/00107
§ 371 Date: Jan. 18, 1981
§ 102(e) Date: Jan. 12, 1981

[87] PCT Pub. No.: WO80/02623
PCT Pub. Date: Nov. 27, 1980

[30] Foreign Application Priority Data

May 18, 1979 [JP] Japan .................................. 54-61232

[51] Int. Cl.³ ............................................. H01L 21/22
[52] U.S. Cl. ..................................... 148/187; 29/578; 148/189
[58] Field of Search ...................... 148/187, 189, 188; 29/578

[56] References Cited

U.S. PATENT DOCUMENTS

| 3,783,045 | 1/1974 | Ronzi ................................ 148/187 |
| 4,029,527 | 6/1977 | Glasl et al. ......................... 148/187 |
| 4,046,605 | 9/1977 | Nelson et al. ...................... 148/175 |
| 4,046,606 | 9/1977 | Lambert ............................. 148/187 |
| 4,168,999 | 9/1979 | Vora et al. ..................... 148/187 X |

Primary Examiner—G. Ozaki
Attorney, Agent, or Firm—Staas & Halsey

[57] ABSTRACT

A process for producing a semiconductor device and for minimizing the effects of implanted boron on a silicon dioxide insulator layer is presented. The process includes the using of a silicon nitride film having windows to define the regions of a semiconductor device, such as a bipolar transistor and isolation regions wherein the isolation region and the semiconductor regions are formed by thermal diffusion of boron using a self-alignment production process. A first mask of the silicon nitride film is formed by patterning it in the form of an endless stripe so that the influence of the reaction between the boron and silicon nitride upon the silicon nitride film is considerably reduced as compared with the conventional process. As a result, the problem of low production yield and low reliability of the semiconductor device is solved.

5 Claims, 7 Drawing Figures

PROCESS FOR PRODUCING A SEMICONDUCTOR DEVICE

BACKGROUND OF THE INVENTION

The present invention relates to a process for producing a semiconductor device, more particularly, to a process including the step of introducing boron impurities into a semiconductor body in self alignment, utilizing a silicon nitride film.

In a process for producing a semiconductor device, a silicon nitride film is first selectively removed to form windows conforming to the dimensions of predetermined elements of the semiconductor device, and subsequently, impurities including boron are introduced through the windows, and onto the semiconductor body surface to form the device elements in self alignment with the selectively removed silicon nitride film. Various semiconductor device structures, for example an iso-planar structure produced by self alignment, have been invented for the purpose of reducing the size of a semiconductor element to be as small as possible and, hence, increasing the integration density of integrated circuits. The defining borders of a film including the silicon nitride film, are hereinafter referred to as patterning. In the production of a bipolar transistor by utilizing self alignment, a silicon nitride film is patterned so as to form windows exposing a silicon dioxide film beneath the silicon nitride film. Then windows exposing the isolation region, the base region and the collector contact region of a silicon layer are successively formed through the silicon dioxide film, using the silicon nitride film as a mask, and then boron impurities are diffused through each window. All of the windows through the silicon nitride film, exposing the silicon dioxide film, are simultaneously formed to prevent deviation from the desired positions of the three regions mentioned above.

One step for producing a bipolar transistor utilizing self alignment is illustrated in FIG. 1, wherein an isolation region is formed in the NPN bipolar transistor utilizing the conventional self alignment method. In FIG. 1, an N type epitaxial layer (2) is formed on a P type semiconductor substrate (1), and a silicon nitride film (3) is patterned as illustrated in FIG. 1. A silicon dioxide film (4) is formed on the portions of the N type epitaxial layer (2) not covered by the silicon nitride film (3) and is then removed from the isolation region (5). The P type isolation region (5) is formed by gas diffusion using boron bromide ($BBr_3$) as a diffusion source.

It was discovered in experiments conducted by the present inventors that when boron, a commonly used P type impurity, is diffused, the boron reacts with the silicon nitride ($Si_3N_4$) film (3) and generates a disadvantageous phenomenon of the adhering of the reaction mixture on the silicon dioxide film and, thus, degrading the silicon dioxide ($SiO_2$) film. The silicon dioxide film (4) masking one region (6a) is degraded during the successive boron diffusion into the isolation region (5) and the region (6b) of the N type epitaxial layer (2), with the result that boron is caused to diffuse into this region (6a) of the N type epitaxial layer (2) and thus may form a P type region. In extreme cases, the resistance of a region, where a high resistance is to be provided, is abnormally decreased due to this disadvantageous phenomenon.

In recent years, the dimensions of semiconductor elements, such as bipolar transistors, have decrease and, the integration density of semiconductor devices has increased. Thus the surface area of a semiconductor substrate occupied by semiconductor elements is smaller than the area occupied by the metal conductors which connnect the semiconductor elements to each other. Since the metal conductors are formed on the insulating film of the silicon nitride covering the semiconductor substrate, the surface area of the silicon nitride film is larger than the surface area of the semiconductor elements and increases the integration density. Consequently, the degrading of the silicon dioxide film phenomenon due to the reaction between the boron and the silicon nitride film leads to a reduction in the production yield and the reliability of the semiconductor devices.

In order to avoid degrading the silicon dioxide film, measures for protecting the silicon nitride film against reacting with boron have been employed by the applicant. In these methods the silicon nitride film is covered by a silicon dioxide film which is deposited on the silicon nitride film by a CVD process. However, in these measures the CVD step is necessary, in addition to the conventional steps of producing the semiconductor devices, and thus the production cost of the semiconductor devices is high.

SUMMARY OF THE INVENTION

It is an object of the present invention to eliminate harmful influences on the reliability and production yield of semiconductor devices due to a reaction between boron and a silicon nitride film and to produce semiconductor devices in self alignment utilizing the silicon nitride film.

In accordance with this object the present invention provides a process comprising the steps of:

forming a silicon nitride film on a semiconductor body;

selectively removing the silicon nitride film so as to form a first mask made of silicon nitride, in the form of an endless stripe, from a plan view;

forming a second mask made of an oxide film on the semiconductor body not covered by the first mask;

selectively removing the second mask, thereby exposing the semiconductor body; and introducing boron impurities into the exposed semiconductor body.

In accordance with the process of the present invention, the mask against the diffusion of boron impurities comprises not only the first mask comprising the nitride, but also the second mask made of the oxide film. Further, since the surface area of the first mask is small due to the thin width, i.e., the stripe form of the first mask, the reaction between boron and silicon ntride occurring at the boron diffusion temperature of approximately 1100° C. results in no harmful effects on the reliability or the production yield of the semiconductor device. The thermal expansion coefficient of silicon nitride, which is a preferable nitride for the first mask, is different from that of the semiconductor body and the Young's modulus of silicon nitride is greater than that of the semiconductor body. Consequently, crystal defects are liable to be induced in the silicon nitride film and in the semiconductor body. The frequency of the occurence of inferior electric characteristics in semiconductor devices due to the crystal defects is decreased by the present invention; compared to the prior art which uses the silicon nitride primarily as a mask against boron diffusion.

In an embodiment of the process of the present invention, the process for producing a semiconductor device comprises the forming of an oxide film on a semiconductor body and then forming a nitride film. In this embodiment mentioned above, since the silicon dioxide film remaining on the semiconductor body is used as a second mask, and further, since the silicon dioxide is customarily formed on the semiconductor body prior to the deposition of the silicon nitride film, no additional processing step is required for the formation of the second mask. It is preferable to increase the thickness of the second mask by heating the second mask comprising silicon dioxide, in an oxidizing atmosphere of $CO_2$, $O_2$, air, etc., to a temperature of from 900° to 1000° C. When the thickness of the second mask is from 3000 to 5000 Angstroms, the masking effect against thermally diffused boron is particularly desirable. In the embodiment mentioned above, by selectively removing or patterning the silicon nitride film, a plurality of windows are simultaneously formed within the first mask and these windows have dimensions corresponding to the regions of a semiconductor device, e..g., isolation, collector-contact and base regions. Accordingly, these regions are formed in self alignment with the patterning of the silicon nitride film.

Instead of forming the silicon nitride film on the silicon dioxide film, the silicon nitride film can be directly formed on the semiconductor body.

DESCRIPTION OF THE PREFERRED EMBODIMENTS

The present invention is explained in detail hereinafter, with reference to FIGS. 2 through 7, by way of an embodiment for forming an NPN bipolar transistor.

Figure 1:
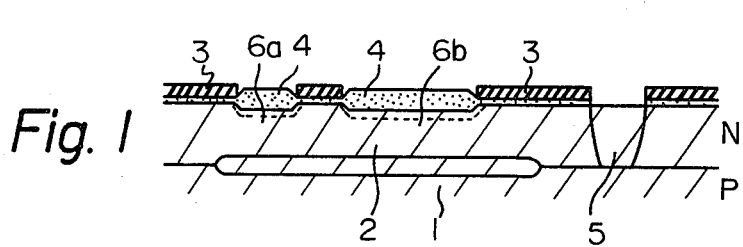
FIG. 1 illustrates a conventional process for producing a semiconductor device and a formation step of an isolation region.
Figure 2:
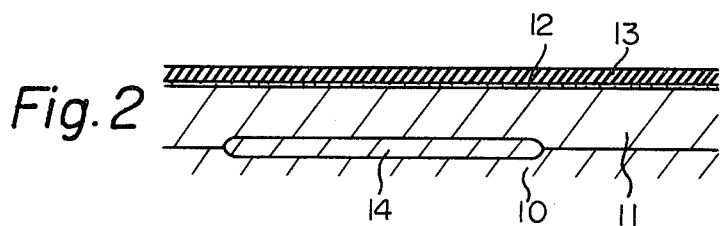
FIGS. 2 through 7 illustrate a sequence of steps of an embodiment of the process according to the present invention.

As illustrated in FIG. 2, an N type epitaxial layer (11) is formed on a p type semiconductor silicon substrate (10). A silicon dioxide ($SiO_2$) film (12) having a thickness of approximately 1,000 Å is formed on the surface of the N type epitaxial layer by a known thermal oxidation, and the upper surface of the silicon dioxide film is covered by a silicon nitride ($Si_3N_4$) film (13) having a thickness of approximately 2,000 Å. Reference numeral (14) indicates an N type buried layer which is formed by selectively diffusing N type impurities into the semiconductor silicon substrate (10).

Figure 3:
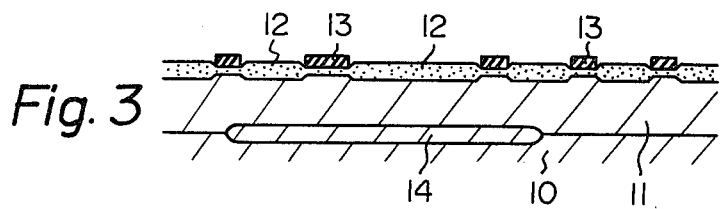
Figure 4:
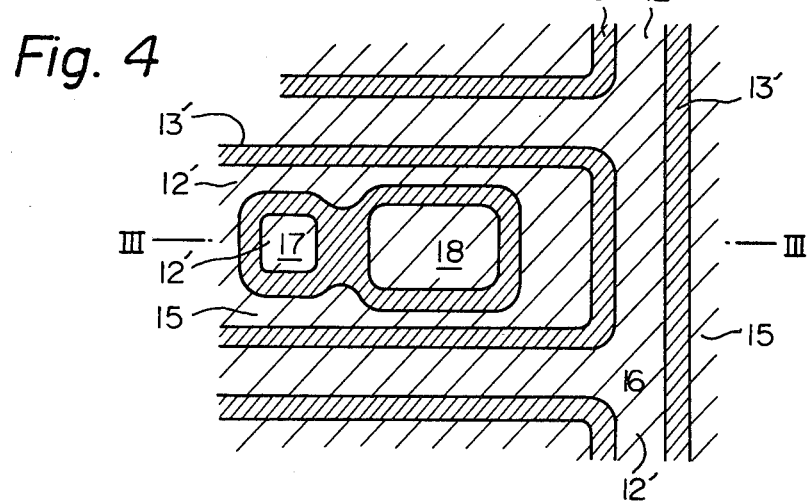

Subsequent to the formation of the silicon nitride film, the silicon nitride ($Si_3N_4$) film (13) is patterned, as illustrated in FIG. 3, using a known photolithographic technique. The patterning of the silicon nitride ($Si_3N_4$) film is conventionally carried out, so that the entire semiconductor layer, except for the regions in which boron is to be diffused, is covered by the silicon nitride film. The silicon nitride ($Si_3N_4$) film (13) is patterned as the first mask. The first mask covers the outer periphery of diffusion regions to be exposed within windows and has a width of approximately 4 microns. Further as illustrated in FIG. 4, the first mask has an endless stripe shape as seen in the plan view. Subsequent to the patterning of the first mask, the silicon of the epitaxial layer (11) is subjected to a high temperature oxidation, so that the thickness of the portions of the silicon dioxide ($SiO_2$) film (12) on which the silicon nitride ($Si_3N_4$) film (13) is not present becomes approximately 3,000 Å. The 3,000 Å thick silicon dioxide film portions form the mask. The second mask (12') comprising the silicon dioxide film covers not only the diffusion regions which have been conventionally masked by silicon dioxide film, but also, the regions which have been conventionally masked by the silicon nitride ($Si_3N_4$) film.

Figure 5:
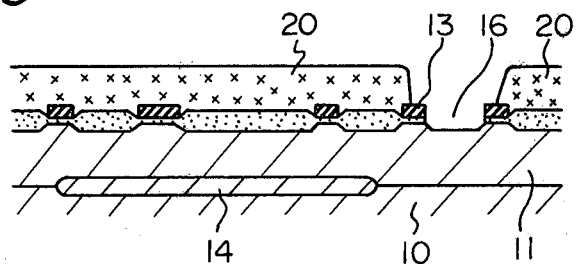

In FIG. 4, a part of the first and second mask pattern is illustrated. Reference numeral (13') indicates the first mask comprising the non-removed silicon nitride ($Si_3N_4$) film and reference numeral (12') indicates the second mask comprising the thick silicon dioxide film. It should be noted here that on the surface of the epitaxial layer (11) covered by the second mask (12'), the silicon nitride ($Si_3N_4$) film is not removed in the conventional process, but is completely removed in the present invention. Windows are formed in the first mask. The inner line of each stripe of the first mask (the outer peripheral line of the window) defines the outer periphery of the regions explained hereinafter. The cross section of the mask patterns along line III—III of FIG. 4 is illustrated in FIG. 5. Windows (16), (17) and (18) are formed by one patterning of the silicon nitride film and have the dimensions of an isolation region, a collector contact region and a diffusion region of a base and an emitter, respectively. These three regions are, therefore, formed in self alignment with the patterning of the silicon nitride film.

It is believed that in the design of the first and second mask patterns illustrated in FIG. 4, the position of each of the windows (16), (17) and (18) may vary, due to the photolithography paterning step from the theoretical position by approximately 2 microns. Even if such deviation occurs, these windows and the associated three regions mentioned above should not overlap each other. In order to provide the first mask with a width sufficient to prevent overlapping, the width of the first mask is approximately 4 microns, as mentioned above, which is twice the deviation. The first mask width is, therefore, not limited to 4 microns, but may be the minimum value required to ensure electric separation of the semicondcutor substrate regions, from each other. This minimum value is dependent upon the accuracy of photolithography patterning.

Figure 6:
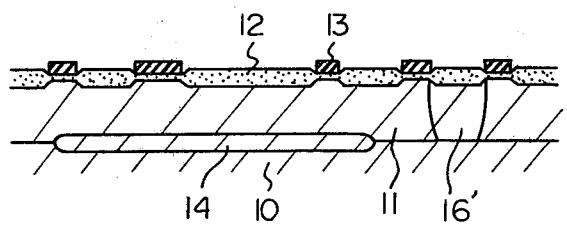

Subsequent to the formation of the first and second masks, a photoresist film (20) is patterned by a photolithographic process, as illustrated in FIG. 5. The silicon dioxide ($SiO_2$) film (12), within the window (16) defining the isolation region, is removed by etching using the photoresist film (20) as a mask, so that a window exposing the epitaxial layer (11) is formed. The dimension of the isolation region is, however, not dependent upon the patterning accuracy of the photoresist film (20), because the window exposing the epitaxial layer is formed in self alignment with the silicon nitride film (first mask). Following the formation of this window, the photoresist film (20) is removed by an organic solvent and, subsequently, an isolation region (16') is formed by diffusion using boron bromide ($BBr_3$) as illustrated in FIG. 6. A thick silicon dioxide film (12') again covers the surface of the isolation region. The adhesion of the product of the reaction of boron with the silicon nitride film upon the silicon nitride ($Si_3N_4$) film is extremely small in the present invention as compared with the conventional process, because the width of the silicon nitride film, which covers the outer periphery of all windows, is a minimum value, as explained above.

Figure 7:
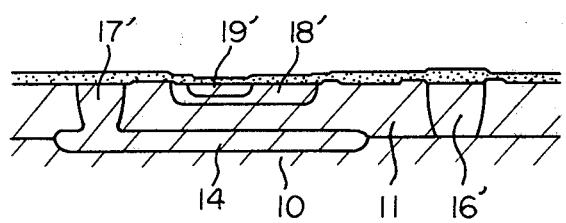

Following the formation of the isolation region, a collector-contact region (17'), a base region (18') and an emitter region (19') are successively formed as illustrated in FIG. 7 by repeating photolithography and diffusion steps similar to those used in the formation of the isolation region. When the formation of these regions is completed, the silicon nitride ($Si_3N_4$) film is removed. Subsequently, the electrode-contact windows (not shown) of the collector-contact region (17'), base region (18') and emitter.

The present invention can be applied in the production of a semiconductor integrated circuit, in which a number of semiconductor elements, such as bipolar transistors, are formed.

What is claimed is:

1. A process for producing a semiconductor device having a semiconductor body, comprising the steps of:
   (a) forming a nitride film on the semiconductor body;
   (b) selectively removing said nitride film to form a first mask comprising an endless stripe of said nitride film;
   (c) masking the semiconductor body not covered by said first mask by a second mask comprising an oxide film;
   (d) selectively removing said second mask in self alignment with said first mask, to expose said semiconductor body; and
   (e) introducing boron impurities into said exposed semiconductor body.

2. A process for producing a semiconductor device according to claim 1, further comprising the step of forming an oxide film on the semiconductor body prior to step (a).

3. A process for producing a semiconductor device according to claim 2, wherein, step (c) further comprises forming said second mask by oxidation, and forming said oxide film not covered by said nitride film to a thickness sufficient to mask the boron impurities.

4. A process for producing a semiconductor device according to claim 1, 2 or 3, wherein step (b), further comprises removing said nitride film so that the width of said first mask is approximately 4 microns.

5. A process for producing a semiconductor device having a semiconductor body, comprising the steps of:
   (a) forming a nitride layer on the semiconductor body;
   (b) forming an endless stripe first mask comprising the nitride layer, by selectively removing the nitride layer from first portions of the semiconductor body;
   (c) forming a second mask by thermally oxidizing the first portions of the semiconductor body;
   (d) forming windows through the second mask in self alignment with the first mask and extending to the semiconductor body; and
   (e) implanting boron impurities into the semiconductor body through the windows.

* * * * *

UNITED STATES PATENT AND TRADEMARK OFFICE
CERTIFICATE OF CORRECTION

PATENT NO. : 4,378,260
DATED : March 29, 1983
INVENTOR(S) : FUKUAA ET AL.

It is certified that error appears in the above-identified patent and that said Letters Patent is hereby corrected as shown below:

```
Column 1, line 36, after "formed" insert --,--;
          line 68, after "Thus" insert --,--.
Column 2, line 10, after "phenomenon" insert --,--;
          line 17, after "methods" insert --,--;
          line 33, after "object" insert --,--;
          line 35, 37, 40, 42 and 44, [do not begin new
    paragraphs];
          line 54, "ntride" should be --nitride,--.
Column 3, line 14, after "mask" insert --,--.
Column 4, line 6, after "the" insert --second--;
          line 7, after "(12)" insert --,--;
          line 36, "paterning" should be --patterning--;
          line 46, "semicondcutor" should be --semiconductor--;
Column 5, line 14, after "emitter" insert --region (19') are
    formed--.
```

Signed and Sealed this

Twenty-third Day of August 1983

[SEAL]

Attest:

Attesting Officer

GERALD J. MOSSINGHOFF

Commissioner of Patents and Trademarks